United States Patent [19]

Munnig Schmidt

[11] Patent Number: 4,603,968
[45] Date of Patent: Aug. 5, 1986

[54] DEVICE FOR EXCHANGING MASKS

[75] Inventor: Robert H. Munnig Schmidt, Drachten, Netherlands

[73] Assignee: U.S. Philips Corporation, New York, N.Y.

[21] Appl. No.: 731,634

[22] Filed: May 7, 1985

[30] Foreign Application Priority Data

May 9, 1984 [NL] Netherlands .......................... 8401476

[51] Int. Cl.$^4$ ............................................. G03B 27/62
[52] U.S. Cl. ......................................... 355/75; 355/53
[58] Field of Search ...................................... 355/53, 75

[56] References Cited

U.S. PATENT DOCUMENTS 4,194,836 3/1980 Rapp et al. ............................. 355/75
4,477,182 10/1984 Takanashi et al. ..................... 355/53

Primary Examiner—Monroe H. Hayes
Attorney, Agent, or Firm—Robert T. Mayer

[57] ABSTRACT

A device for exchanging masks used in the photolithographic treatment of semiconductor devices comprises a rotatable disk (1), on which supporting places for a number of masks (5,6) are present, which disk can be arranged by rotation in a position in which one of the mask supporting places is in a position desired for photolithographic treatment, said position can be determined by means of a detector (19), which, after a position-servo-system has been switched into circuit, supplies a detector signal to this system and thus controls the adjustment of the disk. For rotation of the disk (1), two electromagnetic movement systems (7,13; 8,14) are present each comprising a magnet and a coil, wherein either the pair of magnets or the pair of coils is fixedly arranged and the other pair is provided on the turntable and is rotatable therewith, a current connection for the coils being present to supply a constant current to the coils.

3 Claims, 2 Drawing Figures

DEVICE FOR EXCHANGING MASKS

The invention relates to a device for exchanging masks used in the photolithographic treatment of semiconductor devices, in which device supporting plates for a number of masks are present on a rotatable disk, rotation of the disk bringing one of the mask supporting places in a position desired for photolithographic treatment, which position can be determined by means of a detector, which, after a position servo-system has been switched into circuit, supplies a detector signal to this system and thus controls the adjustment of the disk.

Such a device is described in the published British Patent Application No. 2,096,316; see especially FIG. 13. During the manufacture of semiconductor devices, such as integrated circuits, a number of masks are used successively. It is then necessary that also test patterns are formed on a semiconductor wafer, which are required for controlling the various steps in the manufacture. With step-and-repeat cameras used in the manufacture of semiconductor devices, such as, for example, the device described in GB No. 2,096,316, this exchange of masks for obtaining test patterns is a known processing step. GB No. 2,096 316 does not indicate, how or by which means the disk on which the masks are disposed is brought into the desired position. In practice, the rotatable disk on which the masks are arranged is rotated by means of a step motor with a worm and wormwheel drive. This adjustment is laborious, expensive and works comparatively slowly.

The invention has for its object to provide a device for exchanging masks, in which the mask disk is rotated rapidly and accurately with the aid of comparatively simple means.

In order to achieve this object, according to the invention, the disk is rotatable by means of two electromagnetic movement systems each comprising a magnet and a coil, wherein either the pair of magnets or the pair of coils is fixedly arranged and the other pair is arranged on the turntable and is rotatable therewith, a current connection being provided for the coils and means being present to supply a constant current to the coils.

The movement from one position to the other position can now be effected very rapidly, while the construction remains simple.

Preferably, the electromagnetic movement systems are constructed as immersion coil magnets.

A favourable embodiment, which can be realized in a simple manner, is obtained if both coils are mounted on a support and their windings are series-connected in a manner such that upon connection to a current source a force is produced, which attempts to move a coil away from its associated magnet.

The invention will be described more fully with reference to an embodiment shown in the drawing. In the drawing.

Figure 1:
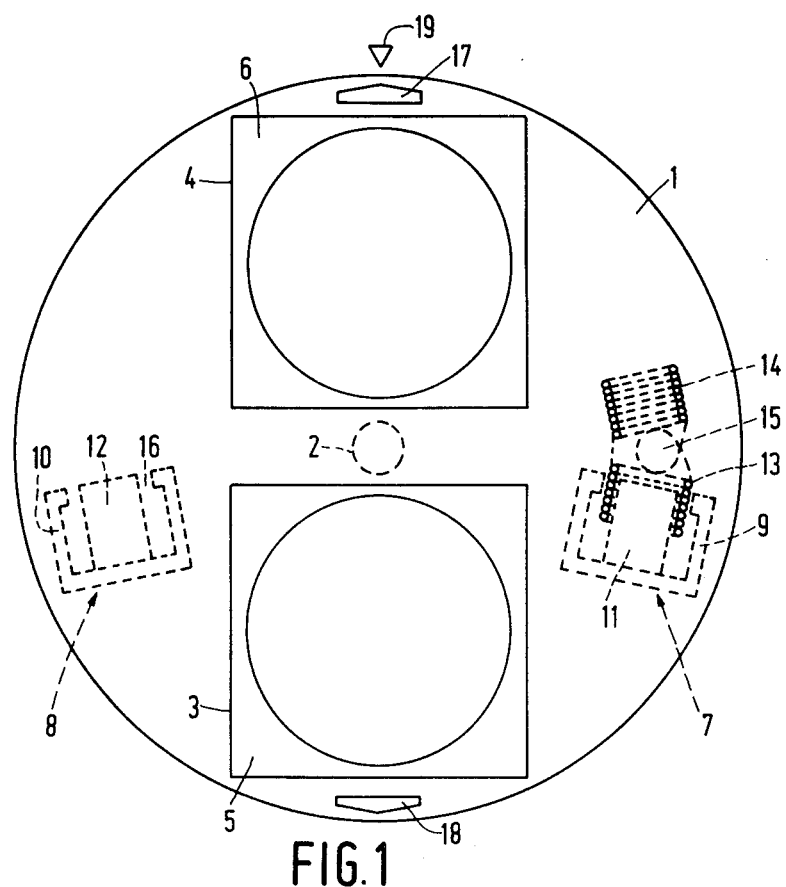
FIG. 1 is a plan view of the turntable for exchanging masks.
Figure 2:
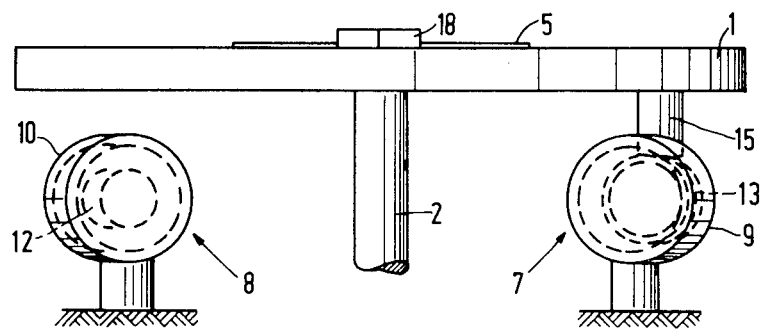
FIG. 2 is a side elevation of the turntable.

The turntable 1, which is disk-shaped, has a shaft 2. The turntable is rotatable about this shaft. On the turntable are situated two supporting places 3, 4, at which a mask 5,6 can be provided. The supporting places are transparent. One of the masks, for example mask 6, serves to form test patterns on a semiconductor wafer to be processed.

Two magnet systems 7 and 8 are fixedly arranged in the apparatus (not shown further) for photolithographically treating semiconductor devices, for example a step-and-repeat camera. The magnet systems 7, 8 shown in the drawing comprise a yoke 9,10 of iron and a magnet 11,12 shown diagrammatically. The side of each magnet facing its associated yoke constitutes, for example, a south pole. The free end of each magnet 11,12 then constitutes a north pole. The magnet systems 7 and 8 may be constructed in any suitable manner; the embodiment shown is given only by way of example.

The magnet systems 7 and 8 each constitute a part of a linear motor. In the embodiment shown, two coils 13 and 14 constitute the other part of the linear motors. The two coils 13,14 are fixedly secured to the turntable 1 by means of a support 15.

The coils 13 and 14 are formed and arranged so that they can move into the gaps 16 between the yokes 9,10 and the magnets 11,12. In the arrangement shown the coils are each located on one side of the support 15. Other arrangements are also possible, for example an arrangement corresponding to a situation in which the coils are each secured to a separate support, which supports are spaced apart by a certain distance. Furthermore, the coils may be fixedly arranged and the magnet systems may be present on the rotatable turntable. Connection means for connecting the coils to electric current may be constructed in any suitable manner not shown.

The coils 13 and 14 may be separately connected to a current source. The connection should be such that the magnetic field produced by the coil has the right polarity for cooperation with the associated magnet system 7 or 8.

However, the coils 13,14 are preferably connected in series in a manner such that, if with a given current connection the coil 13 is expelled from the magnet system 7, with this current connection the coil 14 would be expelled from the magnet system 8.

The turntable is provided with two mirrors 17 and 18, which are preferably constructed as reflecting prisms. Furthermore, a detector unit 19 is fixedly arranged in the apparatus (not shown further) for photolithographically treating semiconductor devices. The detector unit 19 is preferably a radiation source detection unit, which emits a light beam, which upon reflection is reflected by one of the mirrors to the detector unit. The reflected beam can be collected in a detection system, which preferably comprises two detectors as described in the published British Patent Application No. 2,096,316. The difference signal of the two detectors forming the radiation source detection unit can be used to arrange the turntable in the right position. This may be effected by means of a position-servo-system (not shown), which is not the direct subject matter of the invention and which receives a signal from the detector and can control the value of the current in the coils 13 and 14.

The change of positions of the masks can be effected as follows. Let it be assumed that in the position shown in the drawing, the mask 5 occupies the position which is desirable for the photolithographic treatment and that the mask 6 has now to be brought into this position. It is assumed that both coils 13 and 14 are connected in series in a manner as described above. The exchange is effected in that a constant current is superimposed on the coils, the current direction being such that a magnetic field is produced in the coil 13 such that the coil 13 is repelled from the magnet system 7. The turntable 1 is accelerated and rotates until the coil 14 approaches the magnet system 8, the turntable then being decelerated due to the constant current through the coils by the same amount by which it was accelerated in the other position.

When the mirror 18 approaches the detector 19, a short distance before the turntable reaches the desired position, a signal will be supplied by the detector 19, as indicated in the published British Patent Application No. 2,096,316. Due to this signal, when the speed of the turntable has been reduced to zero, the said position-servo-system is switched into circuit. By means of the position-servo-system, the turntable and hence also the mask is brought very rapidly in the desired position, while the detector may pass on a correction signal to the position-servo-system.

What we claim is:

1. A device for exchanging masks used in the photolithographic treatment of semiconductor devices, in which device supporting places for a number of masks are present on a rotatable disk, the disk bringing one of the mask supporting places in a position desired for photolithographic treatment, which position can be determined by means of a detector, which, after a position-servo-system has been switched into circuit, supplies a detector signal to this system and thus controls the adjustment of the disk, characterized in that for rotation of the disk two electromagnetic movement systems are present each comprising a magnet and a coil, wherein either the pair of magnets or the pair of coils is fixedly arranged and the other pair is provided on the turntable and is rotatable therewith, a current connection is present for the coils and means is provided for supplying a constant current to the coils.

2. A device as claimed in claim 1, characterized in that the electromagnetic movement systems are constructed as immersion coil magnets.

3. A device as claimed in claim 1 or 2, characterized in that both coils are mounted on a support and their windings are connected in series in a manner such that upon connection to a current source a force is produced which attempts to move a coil away from its associated magnet.

* * * * *